(12) United States Patent
Jindo et al.

(10) Patent No.: US 10,734,194 B2
(45) Date of Patent: Aug. 4, 2020

(54) PLASMA GENERATING APPARATUS

(71) Applicant: FUJI CORPORATION, Chiryu (JP)

(72) Inventors: Takahiro Jindo, Anjo (JP); Toshiyuki Ikedo, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/463,516

(22) PCT Filed: Nov. 24, 2016

(86) PCT No.: PCT/JP2016/084702
§ 371 (c)(1),
(2) Date: May 23, 2019

(87) PCT Pub. No.: WO2018/096606
PCT Pub. Date: May 31, 2018

(65) Prior Publication Data
US 2019/0378694 A1  Dec. 12, 2019

(51) Int. Cl.
*H01J 37/32* (2006.01)

(52) U.S. Cl.
CPC .... *H01J 37/32055* (2013.01); *H01J 37/3244* (2013.01); *H01J 37/32834* (2013.01); *H01J 37/32825* (2013.01)

(58) Field of Classification Search
CPC ........... H01J 37/32825; H01J 37/32834; H01J 37/32844; H01J 37/32055
USPC ............. 315/111.21, 111.31, 111.51, 111.81, 315/111.9
See application file for complete search history.

(56) References Cited

U.S. PATENT DOCUMENTS

| | | | |
|---|---|---|---|
| 2013/0168361 A1* | 7/2013 | Hori | H05H 1/48 219/69.11 |
| 2013/0174984 A1 | 7/2013 | Hori et al. | |

FOREIGN PATENT DOCUMENTS

| | | | |
|---|---|---|---|
| JP | 2002-151494 A | | 5/2002 |
| JP | 2003-208999 A | | 7/2003 |
| JP | 2006-5007 A | | 1/2006 |
| JP | 2010-103188 A | | 5/2010 |
| JP | 2012-14926 A | | 1/2012 |
| JP | 2012-14927 A | | 1/2012 |
| JP | 2012-252843 A | | 12/2012 |
| JP | 2012252843 A | * | 12/2012 |
| JP | 2013-214377 A | | 10/2013 |
| JP | 2015-128790 A | | 7/2015 |
| JP | 2015128790 A | * | 7/2015 |

OTHER PUBLICATIONS

International Search Report dated Feb. 21, 2017 in PCT/JP2016/084702 filed on Nov. 24, 2016.

* cited by examiner

*Primary Examiner* — Dedei K Hammond
*Assistant Examiner* — Amy X Yang
(74) *Attorney, Agent, or Firm* — Oblon, McClelland, Maier & Neustadt, L.L.P.

(57) ABSTRACT

Plasma generating apparatus includes a pair of electrodes configured to generate plasma by discharge, a first supply path configured to supply processing gas along an outer periphery of each of the pair of electrodes, a second supply path configured to supply processing gas between the pair of electrodes, and a suction path configured to suck the processing gas supplied along an outer peripheral surface of each of the pair of electrodes via the first supply path.

8 Claims, 7 Drawing Sheets

PLASMA GENERATING APPARATUS

TECHNICAL FIELD

The present invention relates to a plasma generating apparatus that generates plasma by allowing discharge to be generated between a pair of electrodes.

BACKGROUND ART

In a plasma generating apparatus, voltage is applied to a pair of electrodes to generate discharge between the pair of electrodes, thereby generating plasma. In this moment, there is a concern that the electrodes and the like are deteriorated due to the discharge, and the deteriorated electrodes and the like are incorporated into a processing target object as a foreign matter. The following Patent Literature describes a technique for suppressing the foreign matter from being incorporated into the processing target object.

PATENT LITERATURES

Patent Literature 1: JP-A-2012-014926
Patent Literature 2: JP-A-2013-214377

SUMMARY OF THE INVENTION

Technical Problem

According to the technique described in above Patent Literature, it is possible to suppress the foreign matter from being incorporated into the processing target object to some extent. However, it is desired to further suitably suppress the foreign matter from being incorporated into the processing target object. The present invention has been made in view of such a circumstance, and an object of the present invention is to suitably suppress the foreign matter from being incorporated into the processing target object.

Solution to Problem

In order to solve the above problem, a plasma generating apparatus described in the present invention includes: a pair of electrodes configured to generate plasma by discharge; a first supply path configured to supply processing gas along an outer periphery of each of the pair of electrodes; a second supply path configured to supply processing gas between the pair of electrodes; and a suction path configured to suck the processing gas supplied along an outer peripheral surface of each of the pair of electrodes via the first supply path.

Advantageous Effect of the Invention

With a plasma generating apparatus described in the present invention, it is possible to suitably suppress a foreign matter from being incorporated into a processing target object.

DESCRIPTION OF EMBODIMENTS

Hereinafter, as description of embodiments, embodiments of the present invention will be described in detail with reference to the drawings.

<Atmospheric Pressure Plasma Irradiation Device>

Figure 1:
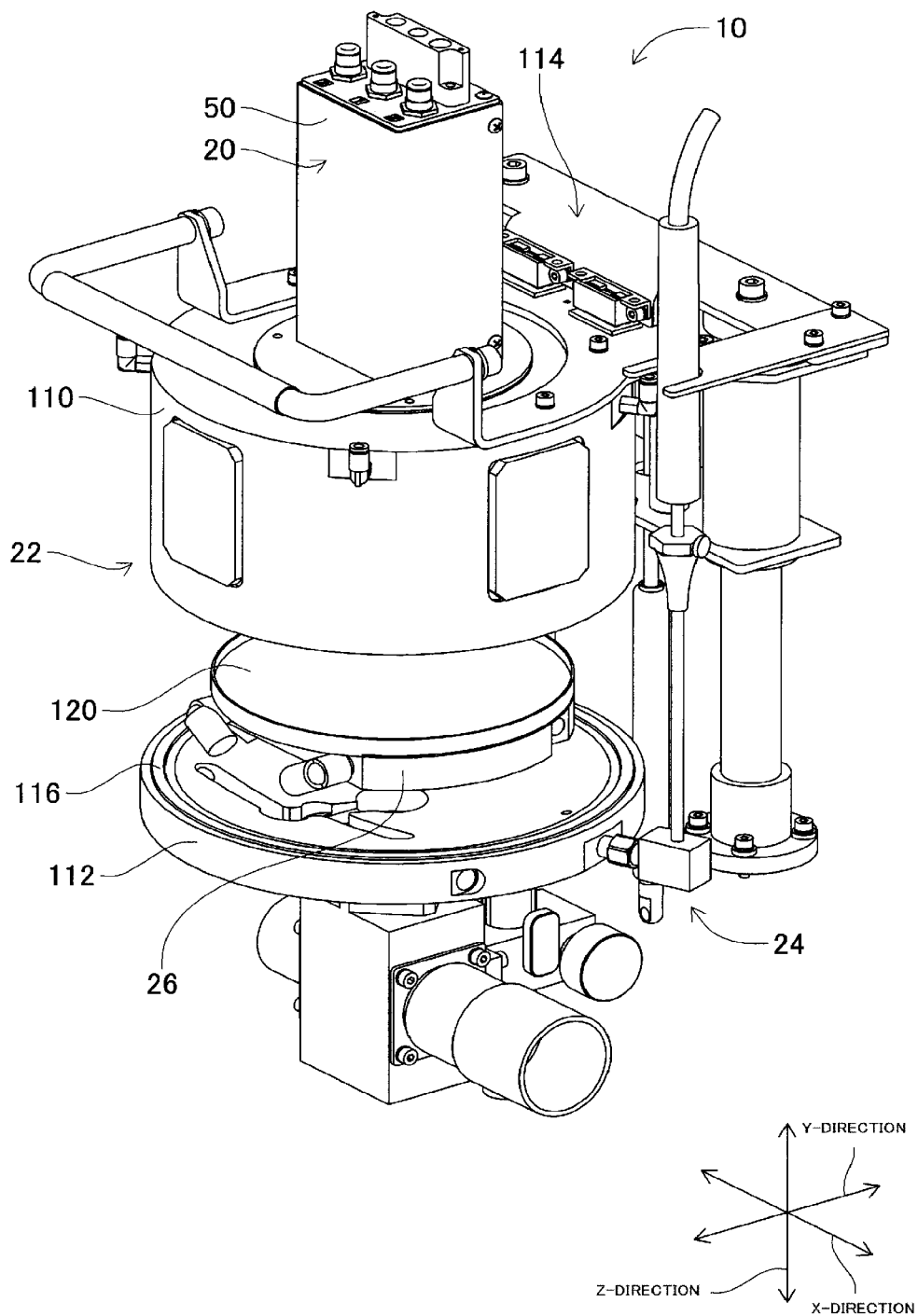
FIG. 1 is a perspective view of an atmospheric pressure plasma irradiation device.

FIG. 1 illustrates atmospheric pressure plasma irradiation device 10 according to an embodiment of the present invention. Atmospheric pressure plasma irradiation device 10 is a device configured to irradiate a culture solution with plasma under atmospheric pressure, and includes plasma generating apparatus 20, cover housing 22, concentration detection mechanism 24, stage 26, purge gas supply device (see FIG. 6) 28, and control device (see FIG. 6) 30. A width direction of atmospheric pressure plasma irradiation device 10 is referred to as an X-direction, a depth direction of atmospheric pressure plasma irradiation device 10 is referred to as an Y-direction, and a direction orthogonal to the X-direction and the Y-direction, that is, an up-down direction is referred to as a Z-direction.

Figure 2:
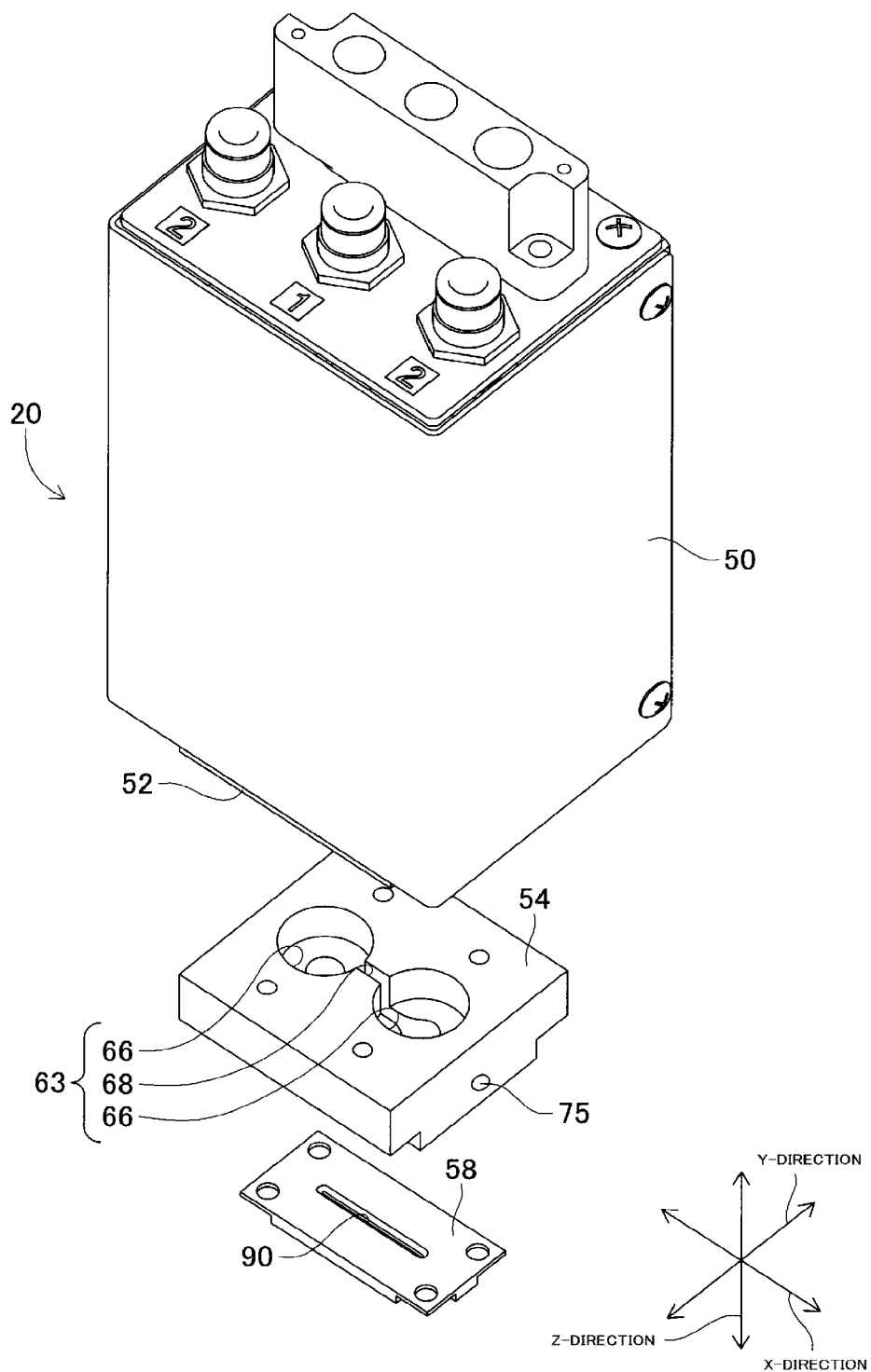
FIG. 2 is an exploded view of a plasma generating apparatus.
Figure 3:
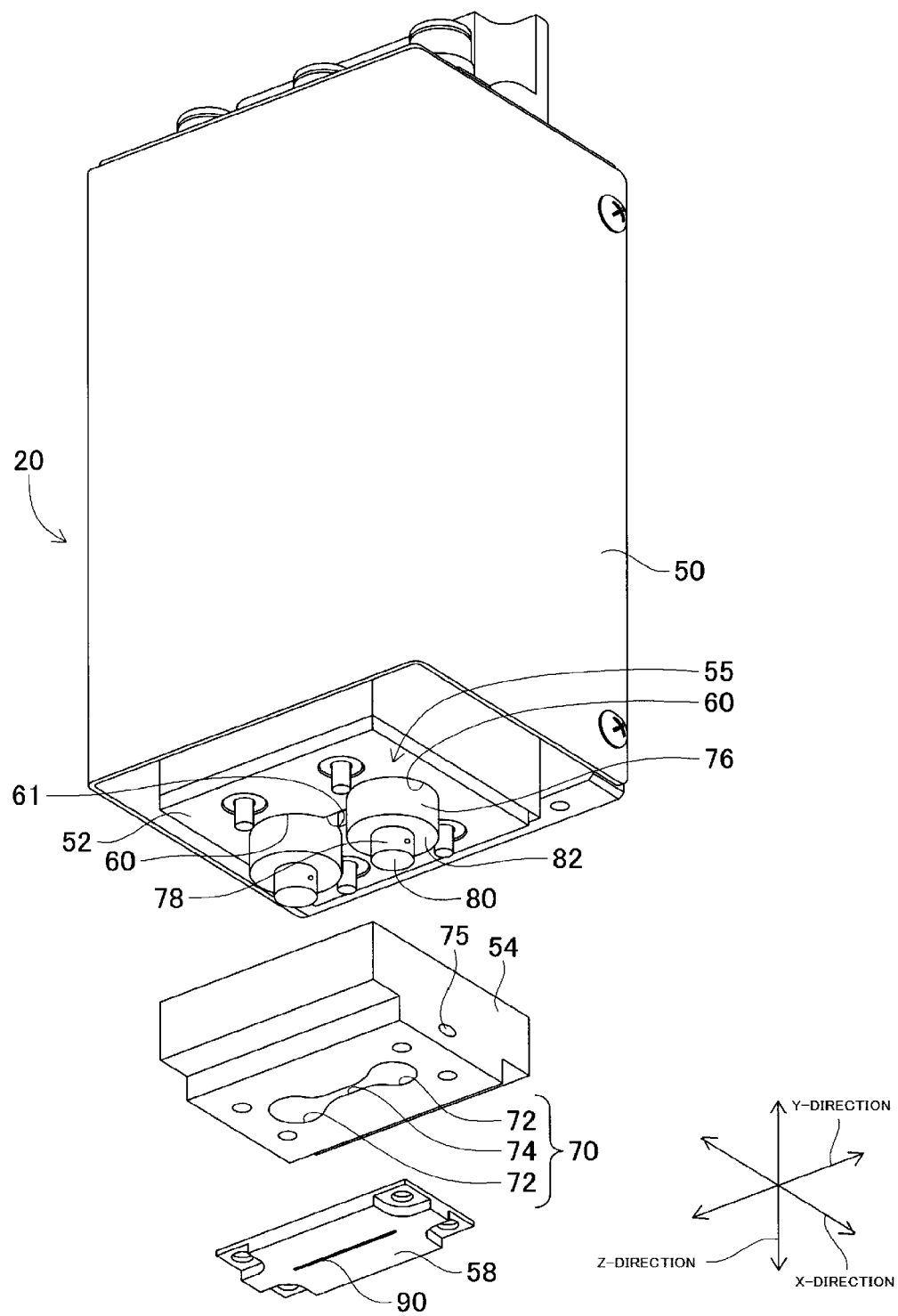
FIG. 3 is an exploded view of the plasma generating apparatus.
Figure 4:
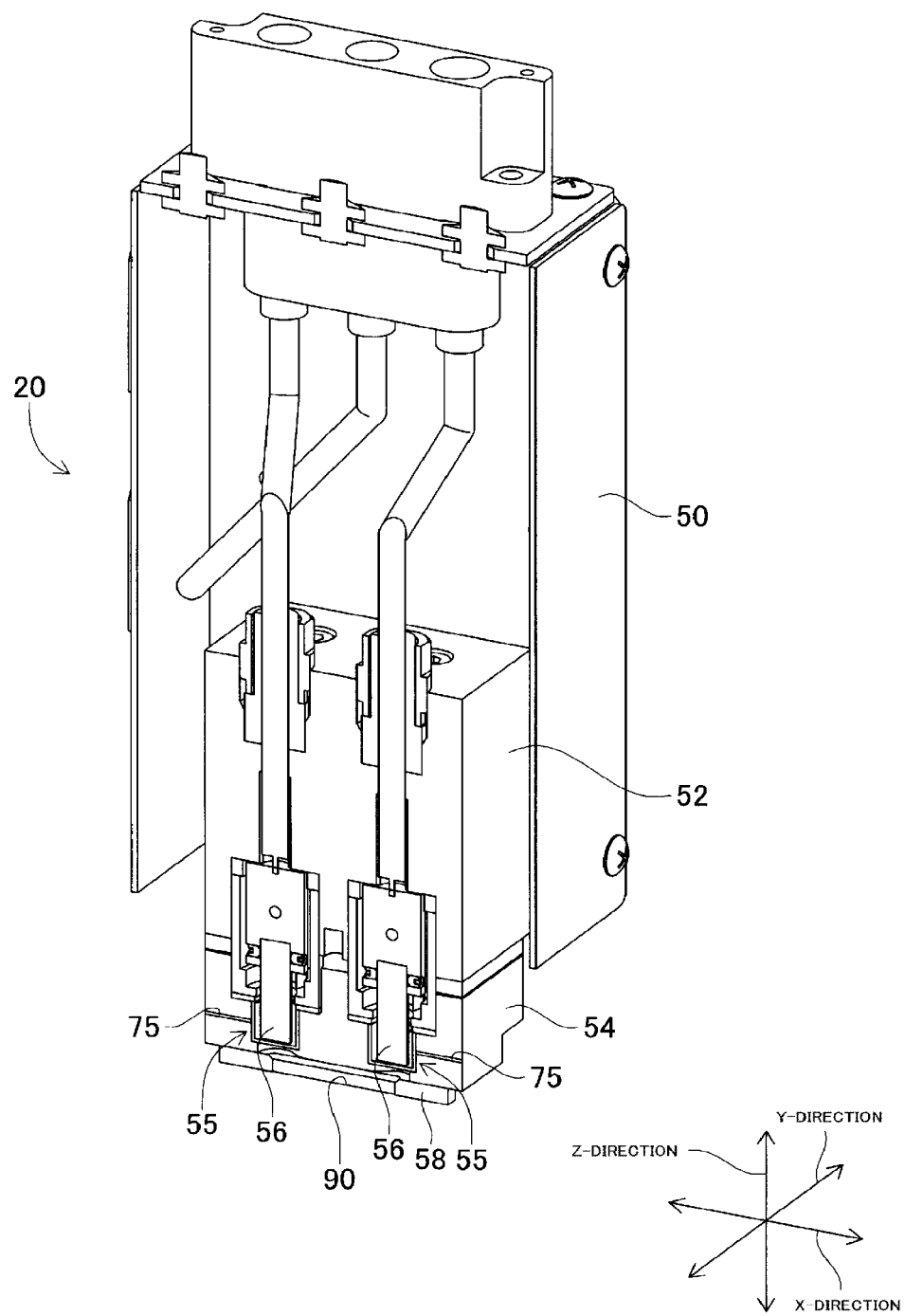
FIG. 4 is a sectional view of the plasma generating apparatus.

As illustrated in FIGS. 2 to 4, plasma generating apparatus 20 includes cover 50, upper block 52, lower block 54, a pair of enclosure members 55, a pair of electrodes 56, and nozzle block 58. Cover 50 has a substantially covered square cylindrical shape, and upper block 52 is disposed inside cover 50.

Figure 5:
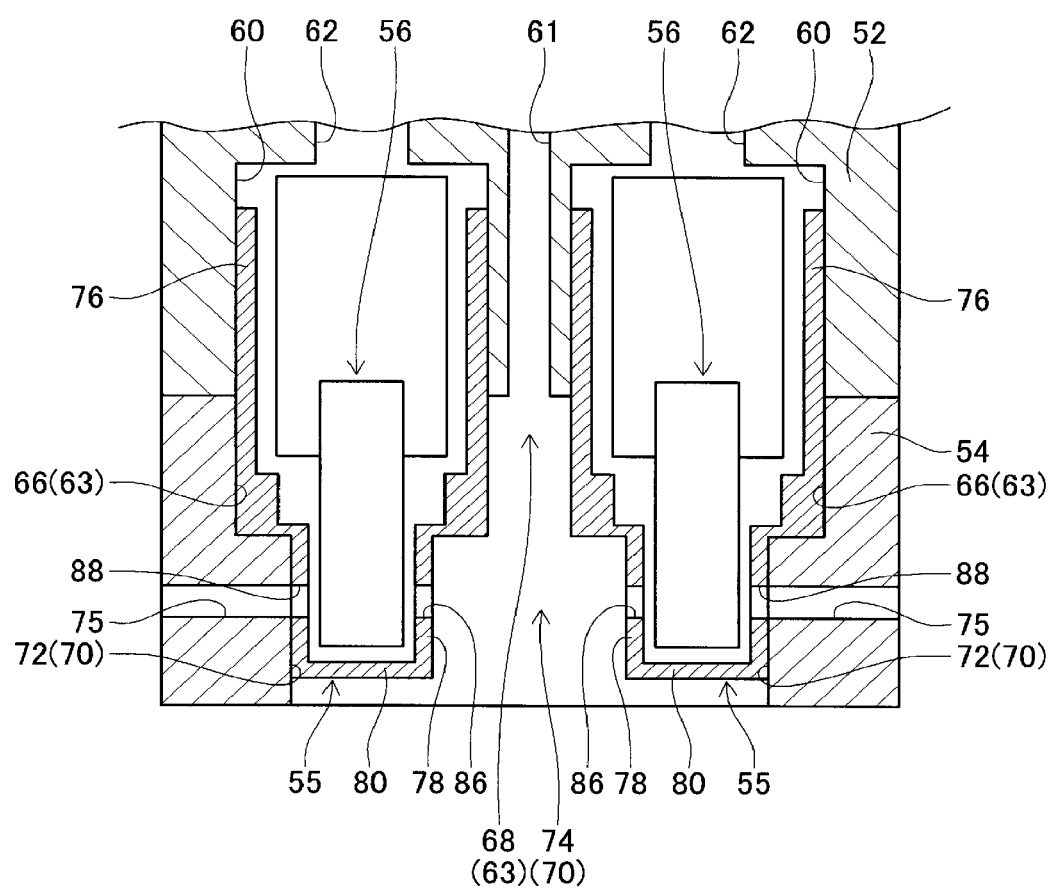
FIG. 5 is an enlarged sectional view of the plasma generating apparatus.

Upper block 52 has a substantially rectangular parallelepiped shape and is formed of ceramic. A pair of cylindrical recessed sections 60 is formed on a lower face of upper block 52. Furthermore, first gas flow path (see FIG. 5) 61 and a pair of second gas flow paths (see FIG. 5) 62 are formed inside upper block 52; first gas flow path 61 opens between the pair of cylindrical recessed sections 60; and the pair of second gas flow paths 62 opens inside the pair of cylindrical recessed sections 60 as illustrated in FIG. 5.

Lower block 54 also has a substantially rectangular parallelepiped shape and is formed of ceramic. Recessed section 63 is formed on an upper face of lower block 54, and is configured to be provided with a pair of cylindrical recessed sections 66 and connecting recessed section 68 which connects the pair of cylindrical recessed sections 66 to each other. In addition, lower block 54 is fixed to the lower face of upper block 52 in a state of projecting from a lower end of cover 50, and cylindrical recessed section 60 of upper block 52 and cylindrical recessed section 66 of lower block 54 communicate with each other. Furthermore, first gas flow path 61 of upper block 52 and connecting recessed section 68 of lower block 54 communicate with each other. Cylindrical recessed section 60 of upper block 52 and cylindrical recessed section 66 of lower block 54 have substantially the same diameter.

In addition, Slit 70 passing through the lower face of lower block 54 is formed on a bottom face of recessed section 63. Slit 70 is configured to include a pair of cylindrical hole sections 72 and connecting hole section 74. An inner diameter of cylindrical hole section 72 is smaller than an inner diameter of cylindrical recessed section 66 of recessed section 63, and cylindrical hole section 72 is formed on a center section of the bottom face of cylindrical recessed section 66. Connecting hole section 74 is formed on the bottom face of connecting recessed section 68 of recessed section 63 and connects the pair of cylindrical hole sections 72 to each other. Furthermore, a pair of suction paths 75 is formed in lower block 54 so as to extend from the pair of cylindrical hole sections 72 to both side surfaces of lower block 54.

Each of the pair of enclosure members 55 has a stepped cylindrical shape with bottom. More specifically, as illustrated in FIG. 5, enclosure member 55 is composed of large diameter section 76, small diameter section 78, and bottom section 80. Large diameter section 76 has a cylindrical shape, and an outer diameter of large diameter section 76 is substantially the same as each of inner diameters of cylindrical recessed section 60 of upper block 52 and cylindrical recessed section 66 of lower block 54. In addition, small diameter section 78 has a cylindrical shape having a smaller diameter than that of large diameter section 76, and continues from a lower end of large diameter section 76 via step surface 82. Furthermore, an outer diameter of small diameter section 78 is substantially the same as the inner diameter of cylindrical hole section 72 of lower block 54. Furthermore, opening on the lower end side of small diameter section 78 is closed by bottom section 80. Thus, enclosure member 55 has a stepped cylindrical shape with bottom.

Enclosure member 55 is fitted into cylindrical recessed section 60 of upper block 52, cylindrical recessed section 66 of lower block 54, and cylindrical hole section 72. More specifically, an upper section of large diameter section 76 of enclosure member 55 is fitted into cylindrical recessed section 60 of upper block 52, and a lower section of large diameter section 76 of enclosure member 55 is fitted into cylindrical recessed section 66 of lower block 54. Furthermore, small diameter section 78 of enclosure member 55 is fitted into cylindrical hole section 72 of lower block 54. As a result, small diameter sections 78 of the pair of enclosure members 55 are facing each other and interposing connecting hole section 74 of slit 70 formed on lower block 54. In addition, a pair of first through-holes 86 is formed on outer peripheral surfaces of the pair of small diameter sections 78 interposing connecting hole section 74 therebetween, the outer peripheral surfaces facing each other. Furthermore, second through-holes 88 are formed on the outer peripheral surfaces of the pair of small diameter sections 78 opposite to each of first through-holes 86. That is, first through-hole 86 and second through-hole 88 are formed on the outer peripheral surface of each small diameter section 78 in contrast with each other with respect to an axial center of each small diameter section 78. In addition, second through-hole 88 formed in small diameter section 78 of enclosure member 55 and suction path 75 formed in lower block 54 communicate with each other.

The pair of electrodes 56 is substantially formed in a rod-shape and inserted within the pair of enclosure members 55. A lower end portion of electrode 56 is inserted into small diameter section 78 of enclosure member 55, and the lower end face of electrode 56 is positioned below first through-hole 86 and second through-hole 88 formed in small diameter section 78. The lower end face of electrode 56 is not in contact with bottom section 80 of enclosure member 55, and a clearance exists between the lower end face of electrode 56 and bottom section 80 of enclosure member 55. Furthermore, an outer diameter of electrode 56 is smaller than an inner diameter of enclosure member 55, and a clearance also exists between an outer peripheral surface of electrode 56 and an inner peripheral surface of enclosure member 55. That is, the lower end portion of electrode 56 is enclosed by enclosure member 55 in a state in which the clearance exists therebetween. In other words, the lower end portion of electrode 56 is covered in the state in which the clearance exists therebetween.

As illustrated in FIGS. 2 to 4, nozzle block 58 has a substantially flat plate shape and is fixed to the lower face of lower block 54. Ejection port 90 communicating with slit 70 of lower block 54 is formed on nozzle block 58 and passes through nozzle block 58 in the up-down direction.

Plasma generating apparatus 20 further includes first processing gas supply device (see FIG. 6) 100, second processing gas supply device (see FIG. 6) 102, and suction pump (see FIG. 6) 104. First processing gas supply device 100 is a device configured to supply processing gas in which an active gas such as oxygen and an inert gas such as nitrogen are mixed at an optional ratio, and is connected to first gas flow path 61 formed in upper block 52. As a result, the processing gas supplied by first processing gas supply device 100 is supplied to connecting recessed section 68 of lower block 54 via first gas flow path 61. Second processing gas supply device 102 is a device configured to supply an inert gas such as nitrogen as processing gas, and is connected to the pair of second gas flow paths 62 formed in upper block 52. As a result, the processing gas supplied by second processing gas supply device 102 is supplied to the pair of cylindrical recessed sections 60 of upper block 52 via second gas flow path 62. Enclosure member 55 is fitted into cylindrical recessed section 60, and electrode 56 is inserted into enclosure member 55 in a state in which the clearance exists. Therefore, the processing gas supplied by second processing gas supply device 102 flows into the clearance provided between the outer peripheral surface of electrode 56 and the inner peripheral surface of enclosure member 55. Suction pump 104 is a pump for suctioning gas, and is connected to suction path 75 formed in lower block 54. As a result, the processing gas is sucked by suction pump 104 via second through-hole 88 and suction path 75 from the clearance between the inside of enclosure member 55, that is, the outer peripheral surface of electrode 56 and the inner peripheral surface of enclosure member 55.

As illustrated in FIG. 1, cover housing 22 includes upper cover 110 and lower cover 112. Upper cover 110 has a substantially covered cylindrical shape, and is slidably held in the Z-direction by slide mechanism 114. A through-hole (not illustrated) having a shape corresponding to lower block 54 of plasma generating apparatus 20 is formed in a lid section of upper cover 110. Cover 50 of plasma generating apparatus 20 is fixed in a state of standing on the lid section of upper cover 110 so as to cover the through-hole. For this reason, lower block 54 and nozzle block 58 of plasma generating apparatus 20 protrude toward the inside of upper cover 110 so as to extend in the Z-direction. As a result, the plasma generated by plasma generating apparatus 20 is ejected in the Z-direction from ejection port 90 of nozzle block 58 toward the inside of upper cover 110.

Lower cover 112 of cover housing 22 has a substantially disk-shape, and is fixed to a housing (not illustrated) of a placement section on which atmospheric pressure plasma irradiation device 10 is placed. An outer diameter of lower cover 112 is larger than an outer diameter of upper cover 110, and annular packing 116 having the same diameter as that of upper cover 110 is disposed on an upper face of lower cover 112. When upper cover 110 is slid downward by slide mechanism 114, a lower end of upper cover 110 comes into close contact with packing 116, and the inside of cover housing 22 is sealed.

Concentration detection mechanism 24 includes detection sensor (see FIG. 6) 118 and is connected to lower cover 112 of cover housing 22. Detection sensor 118 is a sensor for detecting oxygen concentration, and oxygen concentration inside cover housing 22 is detected by detection sensor 118 when cover housing 22 is sealed.

Stage 26 has a substantially disk-shape, and petri dish 120 is placed on an upper face of stage 26. An outer diameter of stage 26 is smaller than the outer diameter of lower cover 112. The stage 26 is disposed on the upper face of lower cover 112.

Purge gas supply device (see FIG. 6) 28 is a device configured to supply an inert gas such as nitrogen and is connected to an air joint disposed on upper cover 110 of cover housing 22. As a result, purge gas supply device 28 supplies the inert gas to the inside of cover housing 22 in a state in which upper cover 110 is slide downward, that is, in a state in which the inside of cover housing 22 is sealed.

Figure 6:
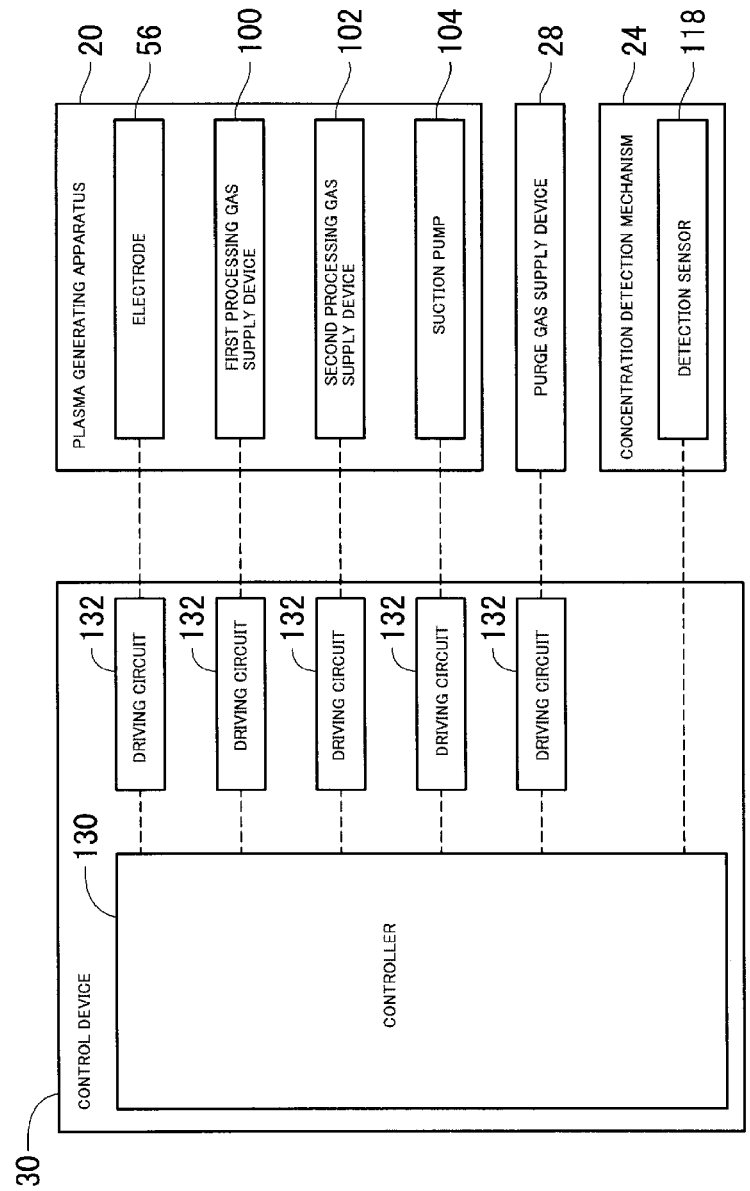
FIG. 6 is a block diagram of a control device.

As illustrated in FIG. 6, control device 30 includes controller 130 and multiple drive circuits 132. Multiple drive circuits 132 are connected to electrodes 56, first processing gas supply device 100, second processing gas supply device 102, suction pump 104, and purge gas supply device 28, respectively. Controller 130 includes CPU, ROM, RAM, and the like, and mainly configured as a computer, and is connected to multiple drive circuits 132. As a result, operations of plasma generating apparatus 20 and purge gas supply device 28 are controlled by controller 130. Furthermore, controller 130 is connected to detection sensor 118. As a result, controller 130 acquires a detection result detected by detection sensor 118, that is, oxygen concentration inside cover housing 22.

<Plasma Irradiation by Atmospheric Pressure Plasma Irradiation Device>

In atmospheric pressure plasma irradiation device 10 with the above-described configuration, petri dish 120 storing the culture solution is placed on stage 26 and a culture solution is irradiated with plasma by using plasma generating apparatus 20 in a state in which cover housing 22 is sealed. Hereinafter, plasma irradiation to the culture solution will be described in detail.

First, petri dish 120 storing the culture solution is placed on stage 26. Next, upper cover 110 of cover housing 22 is lowered to seal cover housing 22. Then, an inert gas is supplied to the inside of cover housing 22 by purge gas supply device 28. At this time, oxygen concentration in cover housing 22 is detected by detection sensor 118 of concentration detection mechanism 24. Then, after it is confirmed that the detected oxygen concentration becomes equal to or lower than a preset threshold value and the inert gas is sufficiently supplied, plasma is ejected into cover housing 22 by plasma generating apparatus 20.

Specifically, in plasma generating apparatus 20, a mixed gas of an active gas such as oxygen and an inert gas such as nitrogen is supplied as processing gas to first gas flow path 61 by first processing gas supply device 100. The processing gas supplied to first gas flow path 61 flows between the pair of enclosure members 55, and is supplied to connecting hole section 74 of slit 70 via connecting recessed section 68 of recessed section 63. In other words, the processing gas is supplied between small diameter sections 78 of the pair of enclosure members 55. An amount of the processing gas supplied by first processing gas supply device 100 per unit time is 2.1 L/min, and the processing gas of 2.1 L/min is supplied between small diameter sections 78 of the pair of enclosure members 55.

In plasma generating apparatus 20, inert gas such as nitrogen is supplied as processing gas to the pair of second gas flow paths 62 by second processing gas supply device 102. The processing gas supplied to the pair of second gas flow paths 62 flows into each of the pair of enclosure members 55 and is supplied between the outer peripheral surface of electrode 56 and the inner peripheral surface of enclosure member 55. An amount of the processing gas supplied by second processing gas supply device 102 per unit time is 1 L/min, and 0.5 L/min of the processing gas is supplied to the inside of each of enclosure members 55.

Furthermore, in plasma generating apparatus 20, the processing gas is sucked from the inside of the pair of enclosure members 55 by suction pump 104 via second through-hole 88 and suction path 75. An amount of the processing gas sucked by suction pump 104 per unit time is 1.1 L/min, and 0.55 L/min of the processing gas is sucked from the inside of each of enclosure members 55.

When the processing gas is supplied by first processing gas supply device 100 and second processing gas supply device 102, and the processing gas is sucked by suction pump 104, voltage is applied to the pair of electrodes 56. As a result, a current flows between the pair of electrodes 56 via first through-holes 86 formed in the pair of enclosure members 55, and pseudo-arc discharge occurs. The pseudo-arc discharge is a method of generating discharge while limiting the current by using a plasma power supply so that a large current does not flow as in normal arc discharge. At this time, the processing gas is turned into plasma due to the pseudo-arc discharge and plasma is generated between small diameter sections 78 of the pair of enclosure members 55, that is, at connecting hole section 74 of slit 70. The plasma generated at connecting hole section 74 of slit 70 is ejected from ejection port 90 of nozzle block 58. As a result, the plasma generated by plasma generating apparatus 20 is ejected into cover housing 22, and the culture solution stored in petri dish 120 is irradiated with the plasma.

As described above, in plasma generating apparatus 20, the processing gas is supplied by first processing gas supply device 100 and second processing gas supply device 102, and is sucked by suction pump 104. When voltage is applied to the pair of electrodes 56, discharge occurs via the pair of first through-holes 86, and plasma is generated. Thus, the incorporation of the foreign matter into the culture solution (so-called contamination) can be suppressed.

Specifically, electrode 56 and the like may carbonize when discharge occurs between the pair of electrodes 56. In such a case, there is a concern that carbonized electrode 56 and the like may fall off and be incorporated into the culture solution as a foreign matter. On the other hand, in plasma generating apparatus 20, electrode 56 is covered by enclosure member 55, and discharge occurs via first through-hole 86 formed in enclosure member 55. Thus, the foreign matter falls into enclosure member 55, and therefore it is possible to prevent the culture solution from being contaminated. In particular, in enclosure member 55, a larger amount (0.55 L/min) of the processing gas than the amount (0.5 L/min) of the processing gas supplied to the inside of enclosure member 55 by second processing gas supply device 102 is sucked from the inside of enclosure member 55 by suction pump 104. Therefore, the pressure inside enclosure member 55 becomes lower than the pressure outside enclosure member 55, that is, the pressure of connecting hole section 74 of slit 70, and the processing gas flows from connecting hole section 74 toward the inside of enclosure member 55 via first through-hole 86 of enclosure member 55. Thereby, it is possible to suitably suppress the foreign matter generated inside enclosure member 55 from falling out of first through-hole 86 of enclosure member 55, and suitably prevent the culture solution from being contaminated.

An amount of plasma generated by plasma generating apparatus 20 per unit time is an amount (2 L/min=2.1+1−1.1) obtained by subtracting an amount (1.1 L/min) of the processing gas sucked by suction pump 104 per unit time from the sum of the amount (2.1 L/min) of the processing gas supplied by first processing gas supply device 100 per unit time and the amount (1 L/min) of the processing gas supplied by second processing gas supply device 102 per unit time. In other words, in a case where a generation amount X of plasma generated by plasma generating apparatus 20 per unit time is set in advance, an amount (Y+Z−X) is obtained by subtracting the generation amount X of plasma generated by plasma generating apparatus 20 per unit time from the sum (Y+Z) of an amount Y of the processing gas supplied by first processing gas supply device 100 per unit time and an amount Z of the processing gas supplied by second processing gas supply device 102 per unit time, and the amount (Y+Z−X) may be sucked from the inside of enclosure member 55 by suction pump 104.

In a typical plasma generating apparatus, a generation amount of plasma per unit time is 10 to 30 L/min, but in plasma generating apparatus 20, a generation amount of plasma per unit time is 2 L/min as described above. As a result, in plasma generating apparatus 20, the air flow of plasma to be ejected is suppressed, and it is possible to suppress the generation of waves, that is, ripples, of the culture solution to be irradiated with the plasma. As described above, in plasma generating apparatus 20, since the generation amount of plasma per unit time is small, even though electrode 56 is covered by enclosure member 55 and discharge occurs via first through-hole 86, an appropriate amount of plasma can be generated.

Furthermore, processing gas containing an active gas such as oxygen is supplied to connecting hole section 74 of slit 70 in which discharge occurs, so that plasma can be preferably generated. On the other hand, an inert gas containing no oxygen is supplied as processing gas to the inside of enclosure member 55. Therefore, since electrode 56 is covered with an inert gas, oxidation of electrode 56 is prevented and durability of electrode 56 is improved.

In addition, since plasma contains active radicals, in a case where plasma reacts with oxygen, ozone is produced, the plasma is deactivated, and as a result an effect of plasma irradiation is lowered. Therefore, in atmospheric pressure plasma irradiation device 10, an inert gas is supplied to the inside of cover housing 22 in a state in which cover housing 22 is sealed. After the oxygen concentration in cover housing 22 becomes equal to or lower than a preset threshold value, the culture solution is irradiated with plasma by plasma generating apparatus 20. As a result, it possible to prevent deactivation of the plasma and to suitably perform irradiation of the plasma.

Furthermore, in the above embodiment, plasma generating apparatus 20 is an example of a plasma generating apparatus. Enclosure member 55 is an example of a enclosure member. Electrode 56 is an example of an electrode. First through-hole 86 is an example of a through-hole. Second through-hole 88 is an example of a suction path. First gas flow path 61 is an example of a second supply path. Second gas flow path 62 is an example of a first supply path.

Figure 7:
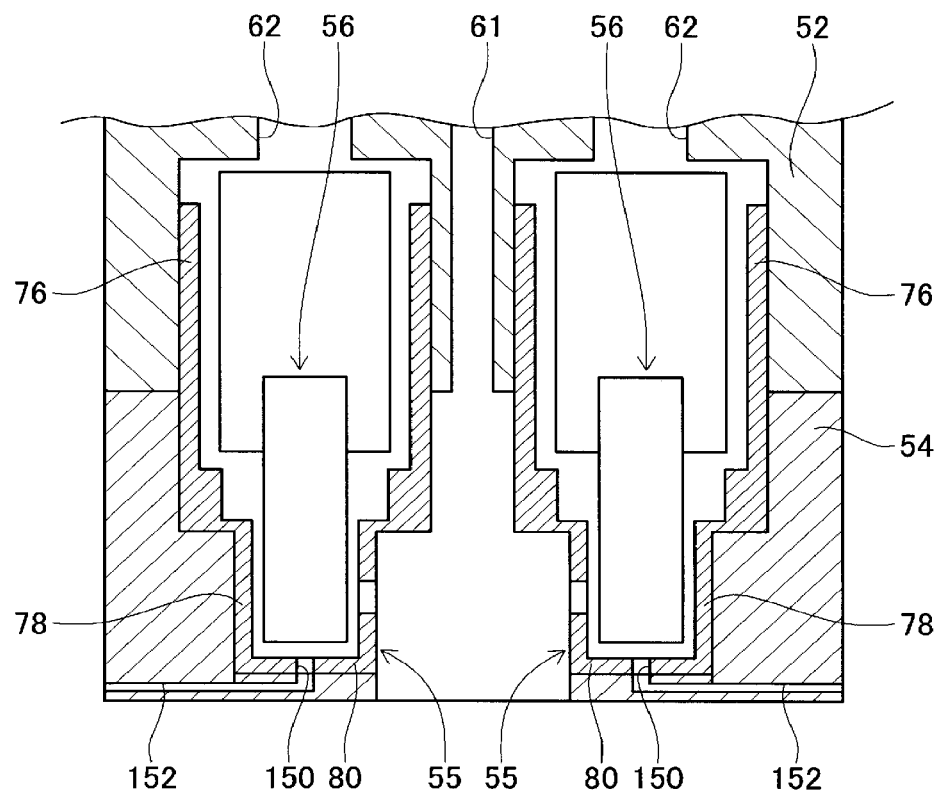
FIG. 7 is an enlarged sectional view of a plasma generating apparatus.

It should be noted that the present invention is not limited to the above-mentioned embodiment, and can be implemented in various modes in which various modifications and improvements are made based on the knowledge of a person skilled in the art. Specifically, for example, in the above embodiment, second through-hole 88 for sucking the processing gas from the inside of enclosure member 55 is formed in the outer peripheral surface of small diameter section 78 of enclosure member 55; however, a through-hole for sucking the processing gas from the inside of enclosure member 55 may be formed in bottom section 80 of enclosure member 55. More specifically, as illustrated in FIG. 7, through-hole 150 is formed in bottom section 80 of enclosure member 55. Furthermore, suction path 152 extending from through-hole 150 to an outer wall surface of lower block 54 is formed in the lower block 54, and suction pump 104 is connected to suction path 152. As a result, suction pump 104 sucks the processing gas from the inside of enclosure member 55 via through-hole 150 and suction path 152, and therefore it is possible to suppress the culture solution from being contaminated.

Furthermore, the amount of the processing gas supplied by second processing gas supply device 102 per unit time and the amount of the processing gas sucked by suction pump 104 can be set to any amount as long as the amount of the processing gas sucked by suction pump 104 per unit time is larger than the amount of the processing gas supplied by second processing gas supply device 102 per unit time. In such a case, as the amount of the processing gas sucked by suction pump 104 per unit time increases, contamination can be effectively suppressed. Furthermore, the amount of the processing gas supplied by first processing gas supply device 100 per unit time can be set to an optional amount by considering the amount sucked from first through-hole 86 of enclosure member 55 to the inside of enclosure member 55 in accordance with the amount of the plasma generated by plasma generating apparatus 20 per unit time.

In the above embodiment, the culture solution is employed as a processing target object, but a liquid other than the culture solution and various objects can be employed as the processing target object without being limited to the liquid.

REFERENCE SIGNS LIST

20: plasma generating apparatus
55: enclosure member
56: electrode
61: first gas flow path (second supply path)
62: second gas flow path (first supply path)
86: first through-hole (through-hole)
88: second through-hole (suction path)

What is claimed is:
1. A plasma generating apparatus comprising:
a pair of electrodes configured to generate plasma by discharge;
a pair of enclosure members configured to enclose at least an end of a discharge-side in an axial direction of each of the pair of electrodes;
a pair of through-holes is formed in a radial direction of each of the pair of electrodes on outer peripheral surfaces of the pair of enclosure members facing each other;
a first supply path configured to supply processing gas along an outer periphery and the end of each of the pair of electrodes;
a second supply path configured to supply processing gas between the pair of electrodes; and
a suction path configured to suck the processing gas supplied along an outer peripheral surface of each of the pair of electrodes via the first supply path, wherein discharge occurs between the pair of electrodes via the pair of through-holes.

2. The plasma generating apparatus according to claim 1, wherein the second supply path supplies an amount of the processing gas larger than an amount of the processing gas supplied along the outer peripheral surface of each of the pair of electrodes via the first supply path, between the pair of electrodes.

3. The plasma generating apparatus according to claim 1, the plasma generating apparatus further comprising:
   wherein the first supply path supplies processing gas to an inside of each of the pair of enclosure members, and
   the second supply path supplies the processing gas between the pair of enclosure members.

4. The plasma generating apparatus according to claim 3, wherein the suction path is formed at a position different from each of the pair of through-holes formed on each of the pair of enclosure members.

5. The plasma generating apparatus according to claim 3, wherein the suction path is formed on the outer peripheral surface opposite to each of the pair of through-holes formed on each of the pair of enclosure members.

6. The plasma generating apparatus according to claim 3, wherein the suction path is formed at each end portion of the pair of enclosure members.

7. The plasma generating apparatus according to claim 1, wherein the suction path sucks a larger amount of the processing gas than the amount of the processing gas supplied from the first supply path.

8. The plasma generating apparatus according to claim 1, wherein the suction path sucks an amount of the processing gas obtained by subtracting an amount of plasma generated by discharge on the pair of electrodes from the sum of the amount of the processing gas supplied from the first supply path and the amount of the processing gas supplied from the second supply path.

* * * * *